(12) United States Patent
Treusch

(10) Patent No.: US 6,516,011 B1
(45) Date of Patent: Feb. 4, 2003

(54) FOCUSING MULTIPLE LASER BEAMS

(75) Inventor: Hans-Georg Treusch, Tucson, AZ (US)

(73) Assignee: Opto-Power Corp., Tucson, AZ (US)

( * ) Notice: Subject to any disclaimer, the term of this patent is extended or adjusted under 35 U.S.C. 154(b) by 90 days.

(21) Appl. No.: 09/710,800

(22) Filed: Nov. 8, 2000

(51) Int. Cl.$^7$ ................................................ H01S 3/13
(52) U.S. Cl. ....................... 372/29.01; 372/9; 372/108; 359/641; 359/642
(58) Field of Search ..................... 372/29.01, 9, 108; 359/641, 642

(56) References Cited

U.S. PATENT DOCUMENTS 5,513,201 A * 4/1996 Yamaguchi et al. .......... 372/75
5,784,203 A * 7/1998 Beckmann ................... 359/618
5,986,794 A * 11/1999 Krause et al. ............... 359/222

* cited by examiner

Primary Examiner—Paul Ip
Assistant Examiner—Leith A Al-Nazer
(74) Attorney, Agent, or Firm—Howard R. Popper

(57) ABSTRACT

A stack of parallel but laterally separated laser beams emitted from a pair of laterally separated laser diode bars are focused into a single vertical plane through the use of an interleaved array of stacked, angular glass plates. Successive plates oppositely refract laser beams from successive radiating levels of the stacks of laser bars so that beams emerging from the glass plates lie in the same vertical plane, thereby overcoming the lateral displacement among beams emerging from the laser bars.

8 Claims, 1 Drawing Sheet

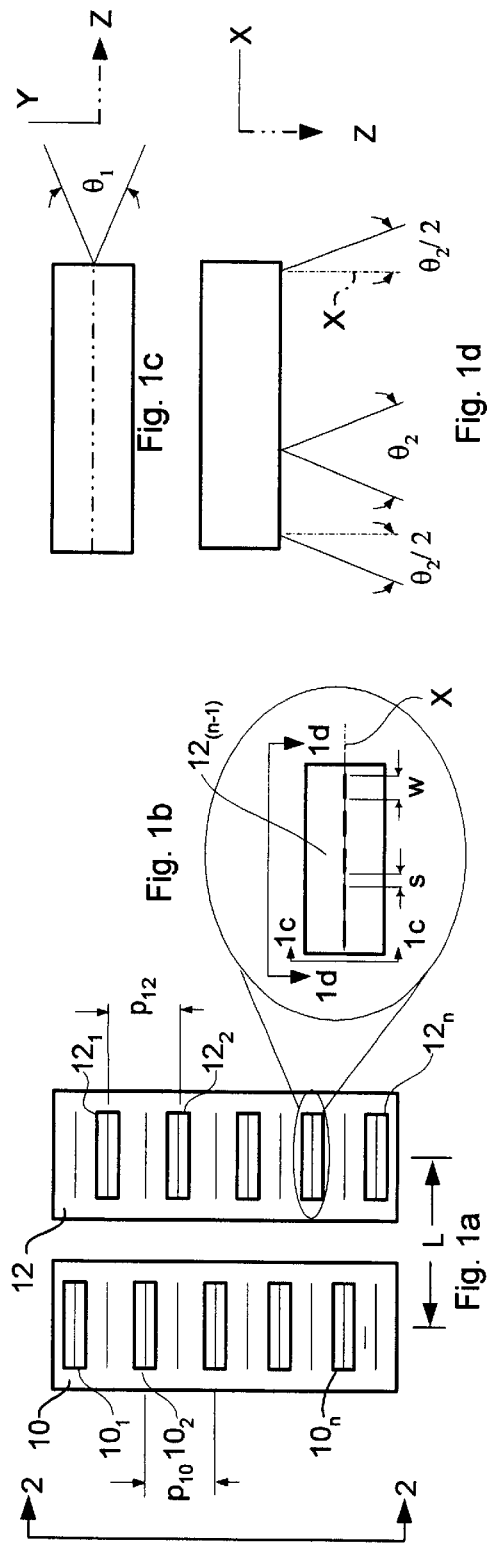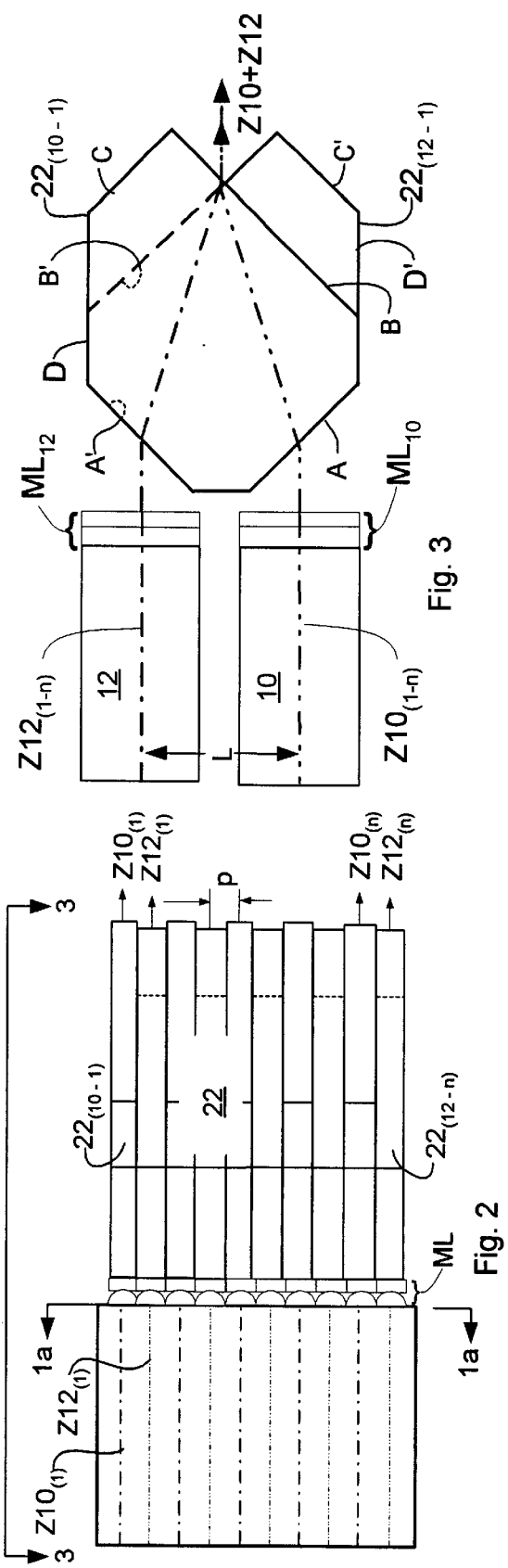

FOCUSING MULTIPLE LASER BEAMS

FIELD OF THE INVENTION

This invention relates to high power lasers for industrial applications and, more particularly, to collimating or focusing the beams from plurality of laser sources.

BACKGROUND OF THE PRIOR ART

Because a diode laser source emits a beam which typically exhibits different degrees of divergence along different axes, a lens or series of lenses such as microlenses are typically used to help focus the emitted light. It should be understood that "focusing" is used here in the sense which includes a range of effects that a lens may have on a diverging beam, from decreasing the divergence to collimation to convergence to a small spot. Generally, the emitting apertures of a laser diode are rectangular in shape with the long dimension having a size of typically hundreds of microns, while the short dimension is typically one micron in size. Diffraction effects cause the emerging radiation to diverge, with the divergence angle being inversely proportional to the size of the aperture. The short dimension of the aperture is comparable to the typical laser diode wavelength of approximately eight hundred nanometers; diffraction effects result in large beam divergence in this, the "fast axis", direction which may be as high as seventy five degrees. The size of the divergence angle is known as the numerical aperture (NA), the beam having a lower numerical aperture along the direction of the stripe than perpendicular to the stripe. Typical values would be NA=0.1 and NA=0.33 respectively. In the applications of concern here, the radiation must be focused at some distance from the laser diode and it is desirable to concentrate the beam diameter so as to maximize the power density at the point of focus.

To provide more power than can be obtained from a single solid state laser, several laser sources can be assembled into a laser "bar" Koester U.S. Pat. No. 3,670,260; U.S. Pat. No. 4,185,891; and Sprague, et al U.S. Pat. No. 4,428,647, show various ways to compensate for the fact that laser bars emit spaced-apart beams. In particular, the '891 and '647 patents show the use of micro-lenses between the laser and an objective lens in which each micro-lens reduces the angle of divergence of a respective light beam leaving the emitting surface of the laser bar. Reducing the divergence angle of the beams allows the objective lens to reduce the beam spacing to a degree that is substantially less than the set spacing between the beams at the laser bar.

While the use of a microlens array reduces the divergence angle among the longitudinally separated beams emanating from the emitting sources of a diode laser, a laser bar which incorporates several, transversely separated diode lasers requires that an objective lens having a large numerical aperture be used if the beam is to be concentrated into a usefully small spot. Large numerical aperture objective lenses tend to be expensive. The problem becomes even more difficult when more power is required than can be delivered by a single laser bar. If it is attempted to use two laser bars, the lateral separation of their beams adds to the difficulty. It would be extremely advantageous to be able to focus such widely separated laser beams to an acceptable spot size without requiring the use of an expensive objective lens.

SUMMARY OF THE INVENTION

In accordance with the principles of the present invention, the laser beams from a pair of laterally separated stacks of laser diode bars are focused into a single vertical plane through the use of an array of interleaved, laterally reversed, identical, angular glass plates, each of said plates having a plurality of edge surfaces including a beam entrance edge surface, a beam exit edge surface and an alignment edge surface. Successive glass plates present complementary oblique entrance surfaces to the laser beams from the two stacks, each plate having an exit surface parallel to its entrance surface, the parallel entrance and exit surface of the plates being spaced apart to refract the laser beams so as to alternately overcome the lateral displacement of the beams from the stacks of laser bars.

BRIEF DESCRIPTION OF THE DRAWING

The foregoing and other objects of the present invention may become more apparent from a reading of the ensuing description together with the drawing, in which:

FIG. 1a is an end view of two laterally separated stacks of laser bars;

FIG. 1b is and enlarged end view of one of the laser bars of FIG. 1a;

FIG. 1c is a side view of the laser bar of FIG. 1b;

FIG. 1d is a top view of the laser bar of FIG. 1b;

FIG. 2 is a side view of the stacks of FIG. 1a together with the stack of interleaved glass plates of the invention; and FIG. 3 is a top view of the stacks and glass plates of FIG. 2.

GENERAL DESCRIPTION

FIG. 1a shows a pair of laterally separated laser bar assemblages 10, 12. Each laser bar assemblage has a respective, vertically stacked array of n solid state laser diode sources $10_1$ through $10_n$ and $12_1$ through $12_n$. The stack of laser diodes of assemblage 10, shown in end-view, have a uniform pitch $p_{10}$ while the stack of laser diodes of assemblage 12, also shown in end-view, has a corresponding uniform pitch $p_{12}$, the laser diodes of assemblage 12 being offset by one-half pitch from those of assemblage 10. The total number of laser diodes, $10_1$ through $10_n$ plus $12_1$ through $12_n$ is determined by the minimum power required to perform a desired function, such as welding, which cannot easily be performed with less than the sum total of power contributed by all of the laser diodes properly focused into a spot of sufficiently small area to achieve a desired power density. The remaining structure in FIGS. 2 and 3 of the drawing illustrates the apparatus of the invention for achieving this goal.

FIG. 1b is an enlarged, end view of an exemplary one, $12_{(n-1)}$, of the n diode lasers of stack 12. Each such diode laser emits light at several points along a narrow stripe labeled "X", the light beam emitting points being separated from each other by some finite distance "s" and each emitting point having an average or nominal lateral dimension "w".

The side view in FIG. 1c shows the light beam divergence angle $\theta_1$ measured in the Y-Z (fast axis) plane of the light beam emitted from one of the emitting points of laser diode $12_{(n-1)}$. The top view in FIG. 1d shows the light beam divergence angle $\theta_2$ measured in the X-Z ("slow axis") plane of the light beam emitted from one of the emitting points. Because of the beam divergence angles $\theta_1$ and $\theta_2$ it is normally advantageous to use a respective microlens array $ML_{10}$, $ML_{12}$ (see FIG. 3) for each stack of laser bar assemblages 10, 12, which has a microlens for each diode laser of the respective assemblage 10, 12. The microlenses of arrays ML achieve a preliminary focus for each of the beams emitted from the solid state lasers.

In FIG. 1a it should be noted that the laser bar assemblages 10 and 12 are constrained by the physical size of their respective structures to be laterally separated from each other in a direction orthogonal to the "Z" axis of the light beam. Even the smallest physically achievable lateral separation, indicated by the dimension "L", must greatly exceed the sum of the "w" dimensions of the emitting points of any individually laser diode. Accordingly, the typical microlens array ML will be unable to overcome this lateral separation between the "Z" axes of the light beams emerging from the two laser bar assemblages. To overcome the lateral separation of the light beams, the present invention resorts to an interleaved stack of advantageously identical, laterally reversed, angular glass plates 22, shown in side view in FIG. 2 and in plan view in FIG. 3. Each of plates 22 has beam entrance edge surface A, a beam exit edge surface B and an alignment edge surface D. When the plates are stacked to be laterally reversed, edge surfaces D are placed in alignment.

Referring to FIG. 3, the pitch p of interleaved glass plate stack 22 is twice as fine as the pitch p10, p12 of either laser assemblage alone so that successive plates of stack 22 intercept successive levels of radiating laser beams from assemblages 10, 12. The top-most plate $22_{(10-1)}$ of stack 22 has its oblique entrance surface A aligned to receive the laser beam emitted along axis $Z10_{(1)}$ of laser $10_1$ of laser bar assemblage 10. The plane of exit surface B of plate 22(10-1) is parallel to the plane of the plate's entrance surface A.

Plate $22_{(12-1)}$, which lies next beneath the top-most plate of stack 22, has its oblique entrance surface A' aligned to receive the laser beam emitted along axis $Z12_{(1)}$ of laser $12_2$ of laser bar assemblage 12. The plane of exit surface B' of plate 22(12-1) is parallel to the plane of the plate's entrance surface A'. The distance between the planes of the entrance and exit surfaces of each plate are dimensioned to cause the beams at the exit surfaces of successive plates to lie in the same vertical plane.

For example, laser beam $Z10_{(1)}$ from the top-most laser of assemblage 10 is refracted by the air/glass interface at the entrance surface A of the top most glass plate $22_{(10-1)}$. This laser beam is again refracted at the glass/air interface at the exit surface B of plate $22_{(10-1)}$. Laser beam Z12(1) from the top-most laser of assemblage 12 is refracted by the air/glass interface at the entrance surface A' of the next lower glass plate $22_{(12-1)}$ of stack 22. This laser beam is again refracted at the glass/air interface at the exit surface B' of plate $22_{(12-1)}$. The angle of refraction at each air/glass interface is substantially opposite in sign to the angle of refraction at the glass/air interface of the same plate so that, at the right hand side of FIG. 3, the stack of beams Z10 from assemblage 10 is interleaved in the same vertical plane with the stack of beams Z12 from assemblage 12 thereby overcoming the lateral separation L between the Z axes of the beams from the two laser bar assemblages. It will be apparent that the combined exit beam Z10+Z12, which occupies a single vertical plane, can more easily be focused by a simple objective lens (not shown) than could possibly be done with exit beams in separate parallel planes. Accordingly the object of the invention has been achieved using a stack of inexpensive interleaved glass plates.

What has been described is deemed to be illustrative of the principles of the present invention. It should be apparent that the planes of the entrance surfaces A, A' of successive plates are advantageously (though not necessarily) chosen to be substantially at right angles to each other. Similarly, the planes of the exit surfaces B, B' of successive plates are advantageously (though not necessarily) chosen to be at substantially right angles to each other. Further and other modifications will be apparent to those skilled in the art and may be made without, however, departing from the spirit and scope of the invention.

What is claimed is:

1. Apparatus for collimating laser beams from a pair of laterally displaced stacks of laser bars, comprising:
   a stack of interleaved, substantially identical plates having a plurality of edges, one edge of each of said plates being a beam entrance surface, another edge of each of said plates being a beam exit surface, and a further edge of each of said plates being an alignment edge for said stack, each said further edge being in plane alignment in said stack, said beam exit surface of each plate being disposed to refract laser beams in a direction opposite to that in which laser beams are diffracted by the plate's entrance surface so that beams from successive ones of said exit surfaces lie in the same plane thereby overcoming the lateral displacement of said laser beams from said laterally displaced stacks of laser bars.

2. Apparatus for collimating laser beams from a pair of laterally displaced stacks of laser bars, having a common pitch p, the bars of one stack being offset by one-half pitch from the bars of the other stack, comprising:
   a plurality of interleaved, substantially identical plates having a plurality of edges, one edge of each of said plates being a beam entrance surface and another edge of each of said plates being a beam exit surface, said exit surface being disposed to refract laser beams in a direction opposite to that in which laser beams are diffracted by said entrance surface, and others of said plurality of edges being stacked in plane alignment to cause beams from successive ones of said exit surfaces to lie in the same plane thereby overcoming the lateral displacement of said laser beams from said laterally displaced stacks of laser bars.

3. Apparatus according to claim 1 wherein the entrance surface of each of said plates is substantially at right angles with the corresponding entrance surface of the next successive one of said plates.

4. Apparatus according to claim 1 wherein said plates are glass and are stacked so that said entrance and exit surfaces of successive plates are laterally reversed.

5. Apparatus according to claim 1 wherein said plates each present an exit surface parallel to its entrance surface.

6. Apparatus s according to claim 2 wherein said plates are stacked on top of one another with a pitch twice as fine as that of the pitch of said stacks of laser bars.

7. Apparatus according to claim 1 wherein alternate ones of said others of said edges of said interleaved plates are aligned in the same plane.

8. Apparatus for focusing into a single vertical plane the laser beams from laterally separated stacks of laser diode bars, comprising:
   an array of interleaved, laterally reversed, identical, angular plates of refractive material; each of said plates having alignment edges and beam entrance and exit edges, successive ones of said plates having their alignment edges in a plane to present complementary oblique ones of said entrance edges to the laser beams from said stacks, each plate having an exit edge parallel to its entrance edge, the parallel entrance and exit edges of said plates being spaced apart to refract the laser beams so as to alternately overcome the lateral displacement of the beams from said laterally separated stacks of laser diode bars.

* * * * *